(12) United States Patent
Zhou et al.

(10) Patent No.: US 11,049,452 B2
(45) Date of Patent: Jun. 29, 2021

(54) LIGHT-EMITTING DRIVING CIRCUIT, DRIVING METHOD, ORGANIC LIGHT-EMITTING DISPLAY PANEL AND DEVICE

(71) Applicant: WUHAN TIANMA MICRO-ELECTRONICS CO., LTD., Wuhan (CN)

(72) Inventors: Maoqing Zhou, Wuhan (CN); Fei Chen, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/910,080

(22) Filed: Jun. 24, 2020

(65) Prior Publication Data
US 2020/0320933 A1    Oct. 8, 2020

(30) Foreign Application Priority Data
Apr. 9, 2020  (CN) .......................... 202010275700.7

(51) Int. Cl.
*G09G 3/30* (2006.01)
*G09G 3/3233* (2016.01)
(Continued)

(52) U.S. Cl.
CPC ....... *G09G 3/3233* (2013.01); *H01L 27/3262* (2013.01); *G09G 2320/064* (2013.01); *H01L 29/78645* (2013.01); *H01L 29/78648* (2013.01)

(58) Field of Classification Search
CPC .. G09G 3/30; G09G 3/32; G09G 3/34; G09G 3/36; G09G 5/00; G06F 3/038;
(Continued)

(56) References Cited

U.S. PATENT DOCUMENTS 10,032,838 B2 * 7/2018 Nie ..................... H01L 27/3248
10,796,625 B2 * 10/2020 Zhou ........................ G09G 3/22
(Continued)

FOREIGN PATENT DOCUMENTS

CN          102184965 A        9/2011
CN          104376815 A        2/2015
(Continued)

*Primary Examiner* — Pegeman Karimi
(74) *Attorney, Agent, or Firm* — Kilpatrick Townsend & Stockton, LLP (57) ABSTRACT

Provided is a light-emitting driving circuit, including: a light-emitting device; a pixel driving circuit including a driving transistor for outputting a light-emitting driving current to the light-emitting device and including an active layer, a first source, a first drain, first and second gates, the active layer includes a source region connected to the first source, a drain region connected to the first drain, and a channel region, both the first and second gates at least partially overlap with the active layer, the first gate is insulated from the second gate, the first drain is electrically connected to the light-emitting device; and a second gate control circuit including a first control device having an input terminal electrically connected to a light adjustment signal line and an output terminal electrically connected to the second gate. A light adjustment voltage is transmitted on the light adjustment signal line in a light adjustment phase.

19 Claims, 6 Drawing Sheets

(51) Int. Cl.
*H01L 27/32* (2006.01)
*H01L 29/786* (2006.01)

(58) Field of Classification Search
CPC ............. H01L 27/3265; H01L 27/3272; H01L 27/3276; H01L 2227/323
See application file for complete search history.

(56) References Cited

U.S. PATENT DOCUMENTS

| | | | | |
|---|---|---|---|---|
| 2007/0052647 A1* | 3/2007 | Chen | ................... | G09G 3/3233 |
| | | | | 345/92 |
| 2016/0379562 A1* | 12/2016 | Yoon | ................. | H01L 29/42384 |
| | | | | 345/215 |
| 2021/0049958 A1* | 2/2021 | Kim | ................... | G09G 3/3266 |

FOREIGN PATENT DOCUMENTS

| | | |
|---|---|---|
| CN | 107358915 A | 11/2017 |
| CN | 110021265 A | 7/2019 |
| CN | 110036435 A | 7/2019 |
| KR | 20170000061 A | 1/2017 |

\* cited by examiner

LIGHT-EMITTING DRIVING CIRCUIT, DRIVING METHOD, ORGANIC LIGHT-EMITTING DISPLAY PANEL AND DEVICE

CROSS-REFERENCE TO RELATED APPLICATIONS

The present application claims priority to Chinese Patent Application No. 202010275700.7, filed on Apr. 9, 2020, the content of which is incorporated herein by reference in its entirety.

FIELD

The present disclosure relates to the field of display technologies, and in particular, to a light-emitting driving circuit, a driving method for driving the light-emitting driving circuit, an organic light-emitting display panel and an organic light-emitting display device.

BACKGROUND

A display is required to be adjustable in its brightness while achieving normal display of an image, to adapt to different environments. Currently, for organic light-emitting display, there are two main brightness adjustment manners as follows. The first brightness adjustment manner lies in adjusting the brightness by controlling a DC signal (referred to as a DC dimming manner). In the DC dimming manner, driving currents having different magnitudes are achieved by controlling a data voltage or a power supply voltage. The second brightness adjustment manner lies in adjusting the brightness by controlling a pulse width of a switch signal (referred to as a pulse width modulation (PWM) dimming manner). In the PWM dimming manner, a light-emitting period is controlled by changing a number of pulses number and a pulse width of a transistor switch signal required to be turned on during a light-emitting phase, to achieve adjustment of the brightness.

With the DC dimming manner, the display effect will deteriorate when it is impossible to make compensation at a low brightness. In addition, the magnitude of the driving current is determined based on the data voltage and the power supply voltage. Therefore, the DC dimming manner will interfere with operation of gray scales. With the PWM dimming manner, serious harm may be caused to human eyes at a low adjustment frequency, while the display brightness needs to be increased at a high brightness, which would cause the organic light-emitting display device to decay fast.

SUMMARY

In view of this, embodiments of the present disclosure provide a light-emitting driving circuit, a driving method for the light-emitting driving circuit, an organic light-emitting display panel, and an organic light-emitting display device.

An embodiment of the present disclosure provides a light-emitting driving circuit, including: a light-emitting device for light-emitting display; a pixel driving circuit including a driving transistor configured to output a light-emitting driving current to the light-emitting device, and the driving transistor includes an active layer, a first source, a first drain, a first gate and a second gate, the active layer includes a source region connected to the first source, a drain region connected to the first drain, and a channel region, both the first gate and the second gate at least partially overlap with the active layer, and the first gate is insulated from the second gate in a first direction; the first drain is electrically connected to the light-emitting device; and the first direction is perpendicular to a plane of the active layer; and a second gate control circuit including a first control device, and the first control device has an input terminal electrically connected to a light adjustment signal line, and an output terminal electrically connected to the second gate; and a light adjustment voltage is transmitted on the light adjustment signal line in a light adjustment phase.

An embodiment of the present disclosure provides a driving method for driving the light-emitting driving circuit according to some embodiments. The driving method includes: in the light adjustment phase, transmitting, by the first control device, the light adjustment voltage transmitted on the light adjustment signal line to the second gate of at least part of the driving transistor.

An embodiment of the present disclosure provides an organic light-emitting display panel, including the light-emitting driving circuit described in the first aspect. The organic light-emitting display panel has a display area and a non-display area, the pixel driving circuit is located in the display area, and the second gate control circuit is located in the non-display area.

An embodiment of the present disclosure provides an organic light-emitting display device, including the organic light-emitting display panel described in the some embodiments.

BRIEF DESCRIPTION OF DRAWINGS

Embodiments of the present disclosure are illustrated by the accompanying drawings. These drawings illustrate some embodiments of the present disclosure.

DESCRIPTION OF EMBODIMENTS

The embodiments of the present disclosure will be described in details with reference to the drawings.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that, the term "and/or" is used in the present disclosure merely to describe relations between associated objects, and thus includes three types of relations. That is, A and/or B can represent: (a) A exists alone; (b) A and B exist at the same time; or (c) B exists alone. In addition, the character "/" generally indicates "or", It is to be noted that, while transistors may be described using terms such as "first", "second" and "third" in the embodiments of the present disclosure, they are not limited by these terms which are used for distinguishing the transistors from one another only. For example, a first transistor may be referred to as a second transistor, without departing from the scope of the embodiments of the present disclosure. Likewise, a second transistor may be referred to as a first transistor.

Figure 1:
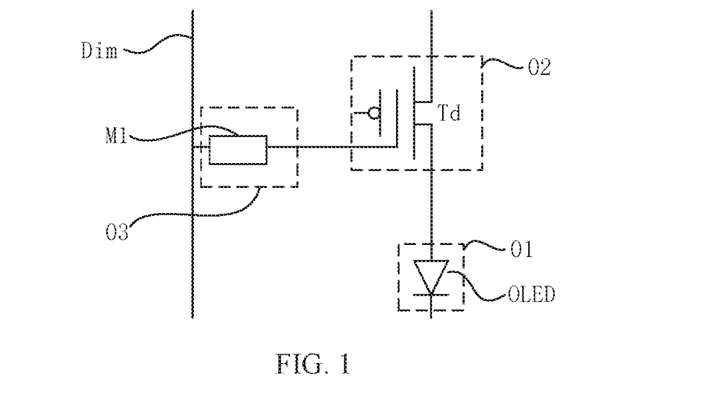
FIG. 1 is a schematic diagram of a light-emitting driving circuit according to an embodiment of the present disclosure.
Figure 2:
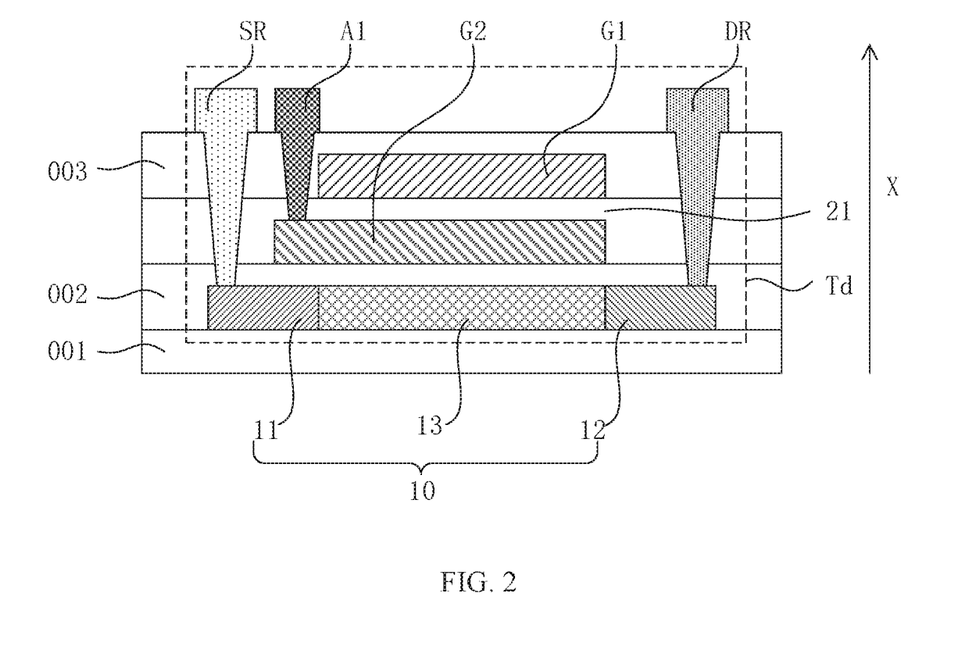
FIG. 2 is a cross-sectional view of a driving transistor according to an embodiment of the present disclosure.

FIG. 1 is a schematic diagram of a light-emitting driving circuit according to an embodiment of the present disclosure, and FIG. 2 is a cross-sectional view of a driving transistor according to an embodiment of the present disclosure.

As shown in FIG. 1, an embodiment of the present disclosure provides a light-emitting driving circuit, which includes a light-emitting device 01, a pixel driving circuit 02, and a second gate control circuit 03.

The pixel driving circuit 02 includes a driving transistor Td, which is configured to output a light-emitting driving current. As shown in FIG. 1, an output terminal of the pixel driving circuit 02 is electrically connected to an input terminal of the light-emitting device 01. Then, in a light-emitting phase, the driving transistor Td in the pixel driving circuit 02 outputs the light-emitting driving current, and the light-emitting driving current is transmitted to the light-emitting device 01 to drive the light-emitting device 01 to emit light.

As shown in FIG. 2, the driving transistor Td includes an active layer 10, a first source SR, a first drain DR, a first gate G1, and a second gate G2. The active layer 10 includes a source region 11, a drain region 12 and a channel region 13. The source region 11 is connected to the first source SR, and the drain region 12 is connected to the first drain DR. Each of the first gate G1 and the second gate G2 at least partially overlaps with the active layer 10. The first gate G1 and the second gate G2 are arranged along a first direction X and insulated from each other, and the first drain D1 is electrically connected to the light-emitting device 01. The first direction X is perpendicular to a plane of the active layer 10. The driving transistor Td is arranged on the substrate 001.

The driving transistor Td may be an N-type transistor, or a P-type transistor as shown in FIG. 1. In the following description, the driving transistor Td being a P-type transistor will be described as an example. It should be noted that, according to common knowledge and different characteristics of the P-type transistor and the N-type transistor, applying an inventive concept of the present disclosure to a light-emitting driving circuit including an N-type transistor also falls within a protection scope of the present disclosure.

In a case in which the driving transistor Td is a P-type transistor, the active layer 10 is an N-type semiconductor substrate. In this case, the source region 11 and the drain region 12 are heavily doped P-type regions, the first source SR is an electrode electrically connected to the source region 11, and first drain DR is an electrode electrically connected to the drain region 12. When a voltage of the first gate G1 and/or a voltage of the second gate G2 is a low-level voltage, more holes may be accumulated in a surface layer of the channel region 13. When a difference between a voltage of the first source SR and a voltage of the gate is larger than a threshold voltage of the driving transistor Td, the holes in the channel region 13 reach a predetermined number, so that the source region 11 is electrically connected to the drain region 12. In this case, a current of the first source SR can flow to the first drain DR. In addition, a difference between the voltage of the first source SR and the voltage of the gate of the driving transistor Td determines a thickness of a channel conductive layer, and thus determines an amount of current arriving at the first drain DR from the first source SR. In other words, when the difference between the voltage of the first source SR and the voltage of the gate of the driving transistor Td is small, an electric field in the channel region 13 is weak, so the thickness of the channel conductive layer is small. That is, a small number of charges are transferred from the first source SR to the first drain DR, resulting in a small light-emitting driving current. When the difference between the voltage of the first source SR and the voltage of the gate of the driving transistor Td is large, the electric field in the channel region 13 is strong, so the thickness of the channel conductive layer is large. That is, a large number of charges are transferred from the first source SR to the first drain DR., resulting in a large light-emitting driving current.

In combination with FIG. 1 and FIG. 2, the second gate control circuit 03 includes a first control device M1. The first control device M1 includes an input terminal electrically connected to a light adjustment signal line Dim, and an output terminal electrically connected to the second gate G2 of the driving transistor Td. A light adjustment voltage is transmitted on the light adjustment signal line Dim during a light adjustment phase. In the light-emitting phase, when light adjustment is required, the driving transistor Td is controlled to be turned on not only based on the difference between the voltage of the first gate G1 and the voltage of the first source SR, but also based on the difference between the voltage of the second gate G2 and the voltage of the first source SR. In other words, in the light adjustment phase, the light-emitting driving current outputted from the driving transistor Td is determined by a combination of the voltage of the first gate G1, the voltage of the second gate G2, and the voltage of the first source SR.

It should be noted that, as shown in FIG, 1 and FIG. 2, the driving transistor Td may further include a second gate signal line A1, and the second gate signal line A1 is connected to the second gate G2 through a via. The light adjustment signal line Dim is electrically connected to the second gate G2 through the second gate control circuit 03 and the second gate signal line A1.

The voltage received by the first gate G1 of the driving transistor Td is a voltage written before the light-emitting phase, and the voltage received by the second gate G2 is a light adjustment voltage transmitted on the light adjustment signal line Dim in the light-emitting phase when light adjustment is required. In the following, an example will be given, in which the driving transistor Td is a P-type transistor.

In the light adjustment phase, for the driving transistor Td, the difference between the voltage of the first gate G1 and the voltage of the first source SR is a first voltage difference $V_1$, an electric field formed between the first gate G1 and the active layer 10 is a first electric field E1, the difference between the voltage of the second gate G2 and the voltage of the first source SR is a second voltage difference $V_2$, and an electric field formed between the second gate G2 and the active layer 10 is a second electric field E2. If a direction of the first electric field E1 is opposite to a direction of the second electric field E2, a difference between an absolute value of the first voltage difference $V_1$ and an absolute value of the second voltage difference $V_2$ determines whether a channel is formed and determines a thickness of the channel conductive layer, and thus determines whether the driving transistor Td outputs a light-emitting driving current and determines the magnitude of the light-emitting driving current. If the direction of the first electric field E1 is the same as the direction of the second electric field E2, a sum of the first voltage difference $V_1$ and the second voltage difference $V_2$ determines whether the channel is formed and determines the thickness of the channel conductive layer, and thus determines whether the driving transistor Td outputs a light-emitting driving current and determines the magnitude of the light-emitting driving current. Therefore, in this embodiment of the present disclosure, the driving transistor Td is provided with two gates for controlling the electric field in the channel region 13 of the driving transistor, controlling a turn-on degree of the driving transistor Td. In this way, the light-emitting driving current outputted from the driving transistor Td can be controlled, to perform light adjustment.

From the above analysis, it can be seen that the second gate G2 function as, in the light adjustment phase, partially counteracting or enhancing an electric field formed between the first gate G1 and the channel region 13 by controlling an electric field formed in the channel region 13 by a light adjustment voltage of the second gate G2.

As shown in FIG. 1, the light-emitting device 01 includes an organic light-emitting diode OLED, and the first drain DR of the driving transistor Td is electrically connected to an anode of the organic light-emitting diode OLED. In addition, it is also possible that the first drain DR of the driving transistor Td is electrically connected to a cathode of the organic light-emitting diode OLED.

It should be noted that the embodiments of the present disclosure do not make any limitation on a structure of the pixel driving circuit 02 in the light-emitting driving circuit. The driving transistor Td in the pixel driving circuit 02 is a transistor that can output the light-emitting driving current in the light-emitting phase.

Figure 3:
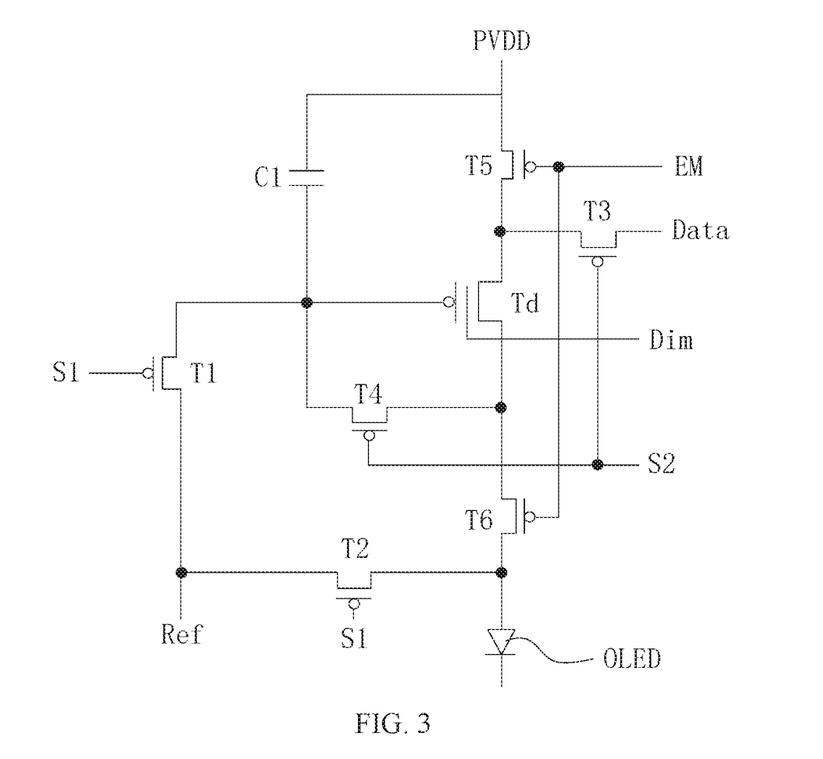
FIG. 3 is a schematic diagram of a pixel driving circuit according to an embodiment of the present disclosure.
Figure 4:
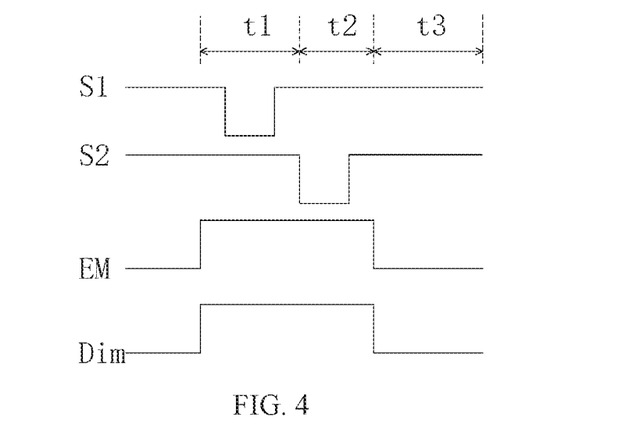
FIG. 4 is a timing sequence diagram of a pixel driving circuit according to an embodiment of the present disclosure.

FIG. 3 is a schematic diagram of a pixel driving circuit according to an embodiment of the present disclosure, and FIG. 4 is a timing sequence diagram of a pixel driving circuit according to an embodiment of the present disclosure. As shown in FIG. 3, the pixel driving circuit 02 includes a driving transistor Td, a first transistor T1, a second transistor T2, a third transistor T3, a fourth transistor T4, a fifth transistor T5, a sixth transistor T6, and a first capacitor C1. The first transistor T1 includes a source connected to a reference voltage signal line Ref, and a drain connected to the first gate G1 of the driving transistor Td. The second transistor T2 includes a source connected to the reference voltage signal line Ref, and a drain connected to the anode of the organic light-emitting diode OLED. The third transistor T3 includes a source connected to a data voltage signal line Data, and a drain connected to the first source SR of the driving transistor Td. The fourth transistor T4 includes a source connected to the first drain DR of the driving transistor Td, and a drain connected to the first gate G1 of the driving transistor Td. The fifth transistor T5 includes a source connected to a power supply voltage signal line PVDD, and a drain connected to the first source SR of the driving transistor Td. The sixth transistor 16 includes a source connected to the first drain DR of the driving transistor Td, and a drain connected to the anode of the organic light-emitting diode OLED. That is, the driving transistor Td can be electrically connected to the organic light-emitting diode OLED through the sixth transistor T6. The first capacitor C1 includes a first electrode plate connected to the power supply voltage signal line PVDD, and a second electrode plate connected to the first gate G1 of the driving transistor Td. The second gate G2 of the driving transistor Td is electrically connected to the light adjustment signal line Dim.

An operation principle of the pixel driving circuit shown in FIG. 3 will be described in the following with reference to FIG. 3 and FIG. 4, and a function of the driving transistor Td related to the inventive concept of the present disclosure should be clearly derived from the following description. It should be noted that an example Witt be given in the following, in which each transistor in the pixel driving circuit is a P-type transistor, however, the transistor in the pixel driving circuit in the present disclosure is not limited to a P-type transistor and may also be an N-Type transistor. As shown in FIG. 4, one operation cycle of the pixel driving circuit shown in FIG. 3 includes an initialization phase t1, a data signal writing phase t2, and a fight-emitting phase t3.

In the initialization phase t1, a turn-on signal, i.e., a low-level signal, is transmitted on a first control signal line Si connected to the gates of the first transistor T1 and the second transistor T2, and then the first transistor Ti and the second transistor T2 are turned on. A reference voltage is transmitted on the reference voltage signal line Ref, then arrives at the first gate G1 of the driving transistor Td through the turned-on first transistor T1 to achieve initialization of the driving transistor Td, and then arrives at the anode of the organic light-emitting diode OLED through the turned-on second transistor T2 to achieve initialization of the organic light-emitting diode OLED. Since the first gate G1 of the driving transistor Td is connected to the first capacitor C1, the reference voltage is stored in the first gate G1 of the driving transistor Td.

In the data signal writing phase t2, a turn-on signal, i.e., a low-level signal, is transmitted on a second control signal line S2 connected to the gates of the third transistor T3 and the fourth transistor T4, and then the third transistor T3 and the fourth transistor T4 are turned on. Then, a data voltage is transmitted on the data voltage signal line Data. At beginning of the data signal writing phase t2, since the first source SR of the driving transistor Td receives the data voltage through the turned-on third transistor T3, a potential of the first source SR of the driving transistor Td is a data voltage and a potential of the first gate G1 of the driving transistor Td is a reference voltage. Then, the driving transistor Td is turned on, since a difference between the data voltage and the reference voltage is greater than an absolute value of a threshold voltage of the driving transistor Td. At this time, the data. voltage is transmitted to the first gate G1 of the driving transistor Td through the turned-on third transistor T3, driving transistor Td, and fourth transistor T4. When the potential of the first gate G1 of the transistor Td is increased to a certain value, that is, when the difference between the voltage of the first source SR and the voltage of the first gate G1 is smaller than the absolute value of the threshold voltage, the driving transistor Td is turned off, and the data signal writing phase t2 ends. This phase is also a phase in which a threshold compensation is performed on the driving transistor Td.

When it is not needed to perform brightness adjustment on the light-emitting device, in the light-emitting phase t3 in which no light adjustment is required, a turn-on voltage, i.e., a low-level signal, is transmitted on a light-emitting control signal line EM connected to the gates of the fifth transistor T5 and the sixth transistor T6, and then the fifth transistor T5 and the sixth transistor T6 are turned on. A power supply power is transmitted on the power supply voltage signal line PVDD. Since the power supply voltage is greater than the potential of the first gate G1 of the driving transistor Td, when the power supply voltage is transmitted to the first source SR of the driving transistor Td through the fifth transistor T5, the potential of the first source SR is greater than the potential of the first gate G1 of the driving transistor Td, and the driving transistor Td is turned on. At this time, the potential of the first drain DR of the driving transistor Td is a difference between the potential of the first source SR and the potential of the first gate G1 and the threshold voltage of the driving transistor Td. The voltage of the first drain DR of the driving transistor Td is transmitted to the organic light-emitting diode OLED through the turned-on sixth transistor T6, causing the organic light-emitting diode OLED to emit light.

When it is needed to perform brightness adjustment on the light-emitting device, in the light-emitting phase t3 in which light adjustment is required, a difference from the light-emitting phase t3 in which no light adjustment is required lies in that the light adjustment voltage is transmitted on the light adjustment signal line Dim to the second gate G2 of the driving transistor Td. At this time, the difference between the voltage of the first gate G1 and the voltage of the first source SR is the first voltage difference $V_1$, and the electric field formed between the first gate G1 and the active layer 10 is the first electric field E1. The difference between the voltage of the second gate G2 and the voltage of the first source S1 is the second voltage difference $V_2$, and the electric field formed between the second gate G2 and the active layer 10 is the second electric field E2. the direction of the first electric field E1 is opposite to the direction of the second electric field E2, and the absolute value of the second voltage difference $V_2$ is smaller than the absolute value of the first voltage difference $V_1$, then the second electric field E2 can counteract a part of the first electric field E1. In this way, a concentration of holes accumulated in the surface layer of the channel region 13 can be reduced, that is, the thickness of the channel conductive layer of the active layer 10 of the driving transistor Td can be reduced, reducing the potential of the first drain DR of the driving transistor Td. In this way, the light-emitting driving current can be reduced, reducing the brightness. If the direction of the first electric field E1 is the same as the direction of the second electric field E2, the second electric field E2 is equivalent to enhancing the electric field strength in the channel region 13 on basis of the first electric field E1, increasing the concentration of holes accumulated in the surface layer of the channel region 13, that is, increasing the thickness of the channel conductive layer of the active layer 10 of the driving transistor Td. In this way, the potential of the first drain DR of the driving transistor Td is increased, and the light-emitting driving current is increased, increasing the brightness. Therefore, different light adjustment voltages are transmitted on the light adjustment signal line Dim to the second gate G2 of the driving transistor Td, achieving display at different brightness.

It should be noted that an operation timing sequence of the pixel driving circuit involved in the embodiments of the present disclosure is not limited to that of the pixel driving circuit shown in FIG. 3. Therefore, the signal received by the driving transistor Td is not limited to the signal described above. It should be understood that the driving transistor Td of the present disclosure is turned on in the light-emitting phase, and directly or indirectly provides the light-emitting driving current to the light-emitting device 01.

Figure 5:
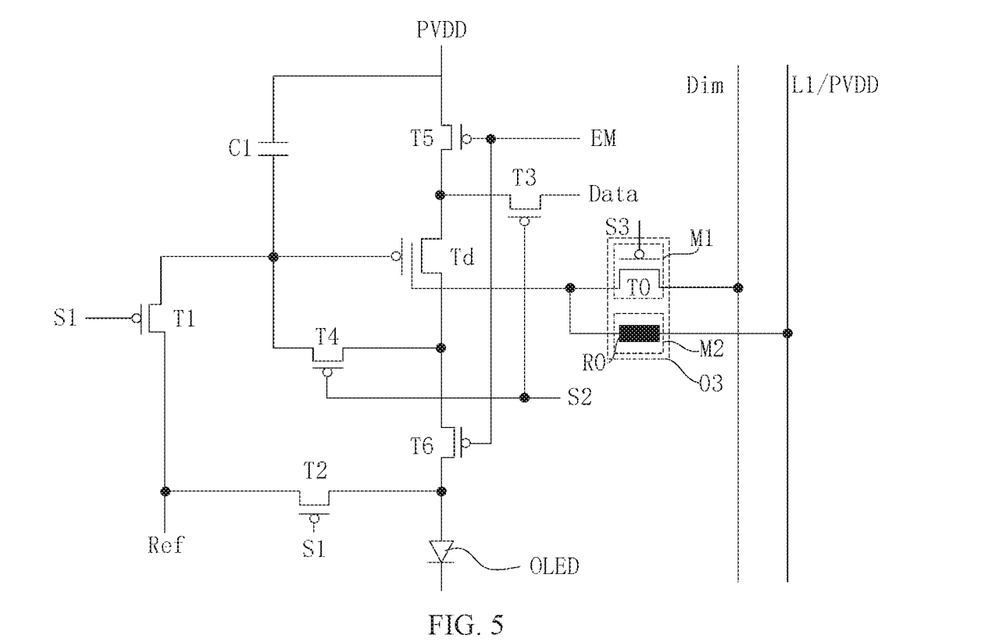
FIG. 5 is a schematic diagram of another light-emitting driving circuit according to an embodiment of the present disclosure.

FIG. 5 is a schematic diagram of another light-emitting driving circuit according to an embodiment of the present disclosure. The pixel driving circuit in the light-emitting driving circuit shown in FIG. 5 is the same as the pixel driving circuit shown in FIG. 3. As shown in FIG, 5, the first control device M1 includes a control transistor T0, and control transistor T0 has a source connected to the input terminal of the first control device M1, and a drain connected to the output terminal of the first control device M1. In other words, the source of the control transistor T0 is electrically connected to the light adjustment signal line Dim, and the drain of the control transistor T0 is electrically connected to the second gate G2 of the driving transistor Td. In the following, an example will he given, in which the control transistor T0 is a P-type transistor. In the light-emitting phase in which light adjustment is required, a turn-on signal, i.e., a low-level signal, is transmitted on a third control signal line S3 connected to the gate of the control transistor T0, and the light adjustment voltage is transmitted on the light adjustment signal line Dim in the light adjustment phase. Then, the control transistor T0 is turned on, and the light adjustment voltage is transmitted to the second gate G2 of the driving transistor Td through the turned-on control transistor T0, performing light adjustment.

As shown in FIG, 5, the second gate control circuit 03 further includes a second control device M2, the second control device M2 has an input terminal connected to a first signal line L1, and an output terminal electrically connected to the second gate G2 of the driving transistor Td. A first signal voltage is transmitted on the first signal line L1. It should he noted that When the input terminal of the second control device M2 is electrically connected to the second gate G2, the input terminal of the first control device M1 is electrically insulated from the second gate G2. When the input terminal of the first control device M1 is electrically connected to the second gate G2, the input terminal of the second control device M2 is electrically insulated from the second gate G2. In other words, the second control device M2 is not turned on during the light-emitting phase 3 in which light adjustment is required.

The second control device M2 may he turned on in phases other than the light adjustment phase. The second control device M2 being turned on means that the second control device M2 can transmit a signal, meaning that a voltage of the input terminal of the second control device M2 is equal to a voltage of the output terminal of the second control device M2. A first signal voltage is transmitted to the second gate G2 of the driving transistor Td through the turned-on second control device M2, and the first signal voltage should cause a fourth electric tiled E4 to be formed between the second gate G2 and the active layer 10 and a third electric field E3 to be formed between the first gate G1 and the active layer 10. Here, a direction of a vector sum of the third electric field E3 and the fourth electric field E4 is the same as the direction of the third electric field E3. Therefore, in the phases other than the light adjustment phase, the driving transistor Td may also be turned on, to achieve reset in the initialization phase t1 and data voltage writing in the data signal writing phase t2.

The second control device M2 includes a semiconductor resistor R0. The semiconductor resistor R0 includes a terminal connected to the input terminal of the second control device M2, and another terminal connected to the output terminal of the second control device M2. That is, one terminal of the semiconductor resistor R0 is connected to the first signal line L1. and another terminal of the semiconductor resistor R0 is connected to the second gate G2 of the driving transistor Td. The semiconductor resistance R0 has a large resistance value. In the light-emitting phase t3 in which light adjustment is required, that is, in the light adjustment phase, since the first control device M1 is turned on, that is, the control transistor T0 is turned on, the potential of the second gate G2 of the driving transistor Td is the light adjustment voltage. Since the semiconductor resistor R0 has a large resistance, even though the potentials of the two terminals of the semiconductor resistor R0 are respectively the first signal voltage and the light adjustment voltage, the semiconductor resistor R0 is equivalent to an open switch. In a phase without light adjustment, the data signal writing phase t2, since the first control device M1 is turned off, i.e., the control transistor T0 is turned off, and the second gate G2 and the semiconductor resistor R0 are components in a non-closed loop, the potential of the second gate G2 is the same as the first signal voltage. Using the semiconductor resistor R0 as the second control device M2 can achieve automatic turn-off and turn-on in the light adjustment phase and in the phase other than the light adjustment phase. Moreover, the semiconductor resistor R0 and the active layer 10 in the pixel driving circuit 02 can be manufactured at the same time, reducing processes thereof.

According to the above analysis, in the light adjustment phase, the difference between the voltage of the first gate G1 and voltage of the first source SR is the first voltage difference $V_1$, that is, $V_1 = V_{G1} - V_{SR}$, where $V_1$ is the first voltage difference, $V_{G1}$ is the voltage of the first gate, and $V_{SR}$ is the voltage of the first source SR. The electric field formed between the first gate G1 and the active layer 10 is the first electric field E1. In the light adjustment phase, the difference between the voltage of the second gate G2 and the voltage of the first source SR is the second voltage difference $V_2$, that is, $V_2 = V_{G2} - V_{SR}$, where $V_2$ is the second voltage difference, $V_{G2}$ is the voltage of the second gate, and $V_{SR}$ is the voltage of the first source SR. The electric field formed between the second gate G2 and the active layer 10 is the second electric field E2. If the first voltage difference $V_1$ and the second voltage difference $V_2$ are both positive values or both negative values, that is, if the direction of the first electric field E1 is the same as the direction of the second electric field E2, the electric field in the channel region 13 is increased, and the thickness of the channel conductive layer is increased. In this case, the light-emitting driving current is increased, and the brightness of the light-emitting device 10 is increased. If one of the first voltage difference $V_1$ and the second voltage difference $V_2$ is a positive value and the other one is a negative value, that is, if the direction of the first electric field E1 is different from the direction of the second electric field E2, the electric field in the channel region 13 is reduced, and the thickness of the channel conductive layer is reduced. In this case, the light-emitting driving current is reduced, and the brightness of the light-emitting device is reduced.

In the phase other than the light adjustment phase, the second gate G2 receives the first signal voltage, the difference between the voltage of the first gate G1 and the voltage of the first source SR is a third voltage difference $V_3$, and the difference between the voltage of the second gate G2. and the voltage of the first source SR is a fourth voltage difference $V_4$. That is, $V_4 = V_{G1} - V_{SR}$, $V_4 = V_{G2} - V_{SR}$, where $V_4$ is the third voltage difference, V4 is the fourth voltage difference, $V_{G1}$ is the voltage of the first gate, $V_{G2}$ is the voltage of the second gate, and $V_{SR}$ is the voltage of the first source SR. The electric field formed between the first gate G1 and the first source SR is the third electric field E3, and the electric field formed between the second gate G2 and the active layer 10 is the fourth electric field E4. If one of the third voltage difference $V_3$ and the fourth voltage difference $V_4$ is a positive value and the other one is a negative value, and an absolute value of the third voltage difference $V_3$ is greater than an absolute value of the second voltage difference $V_4$, then a direction of a vector sum of the third electric field E3 and the fourth electric field E4 is the same as the direction of the third electric field E3. Thus, the potential of the first gate G1 is one of determining factors for controlling on/off of the driving transistor Td. It should be noted that the third electric field E3, the fourth electric field E4, the third voltage difference $V_3$ and the fourth voltage difference $V_4$ described herein are merely used to distinguish in terms of electric fields and voltage differences for different structures in the phase other than the light adjustment phase, and do not indicate that the respective electric fields having a same name in respective phases are the same to each other or that the respective voltage differences having a same name in respective phases are equal to each other.

An operation principle of the second gate G2 performing light adjustment and operation manners in other operation phases will be described in the following in combination with different settings of the second gate G2.

With further reference to FIG. 2, the first gate G1 and the second gate G2 of the driving transistor Td are located at a same side of the active layer 10 in the first direction X, and a first insulation layer 21 is provided between the first gate G1 and the second gate G2. As illustrated in FIG. 2, an insulation layer may also be provided between the second gate G2 and the active layer 10. The first gate G1 and the second gate G2 are located at a same side of the active layer 10, for example, an upper side of the active layer 10, thus the first gate G1 and the second gate G2 are formed after the active layer 10 is formed. Therefore, the first gate G1 and the second gate G2 do not affect flatness of the active layer 10. In addition, an insulation layer 002 is provided between the active layer 10 and the second gate G2, and an insulation layer 003 may be provided between film layers where the first gate G1 and the first source SR are located.

In addition, the second gate G2 may be located at a side of the first gate G1 close to the active layer 10. Since changing of the thickness of the channel conductive layer is actually controlled by an intensity of the electric field in the channel region 13, the thickness of the channel conductive layer being adjusted by the voltage of the second gate G2 is actually achieved by the electric field in the channel region 13 generated by the voltage of the second gate G2. Moreover, since the electric field is not only related to a voltage but also to a distance, the second gate G2 being located at the side of the first gate G1 close to the active layer 10 can more effectively adjust the thickness of the channel conductive layer. That is, a light adjustment effect can be achieved by transmitting a small voltage to the second gate G2.

When the first gate G1 and the second gate G2 are located at a same side of the active layer 10, in the light adjustment phase, if one of the first potential difference $V_1$ and the second potential difference $V_2$ is a positive value and the other one is a negative value, then the brightness can be turned down, and if the first potential difference $V_1$ and the second potential difference $V_2$ are both positive values or both negative values, then the brightness can be turned up.

Further, the greater absolute value of the second potential difference $V_2$ leads to the greater degree of adjustment on the brightness.

In the phase other than the light adjustment phase, the third voltage difference $V_3$ and the fourth voltage difference $V_4$ may be both positive values or both negative values, so that the direction of the third electric field E3 is the same as the direction of the fourth electric field E4, and thus the potential of the gate of the driving transistor Td can control it to be turned on. Alternatively, in the phase other than the light adjustment phase, one of the third voltage difference $V_3$ and the fourth voltage difference $V_4$ is a positive value and the other one is a negative value, and the absolute value of the third voltage difference $V_3$ is greater than the absolute value of the fourth voltage difference $V_4$, so that the direction of the vector sum of the third electric field E3 and the fourth electric field E4 is still the same as the direction of the third electric field E3, and thus an off state of the driving transistor Td is still controlled by the first gate G1. In an embodiment of the present disclosure, the first signal voltage may be the power supply voltage. As shown in FIG. 5, the first signal line L1 may be reused as the power supply voltage signal line PVDD.

Figure 6:
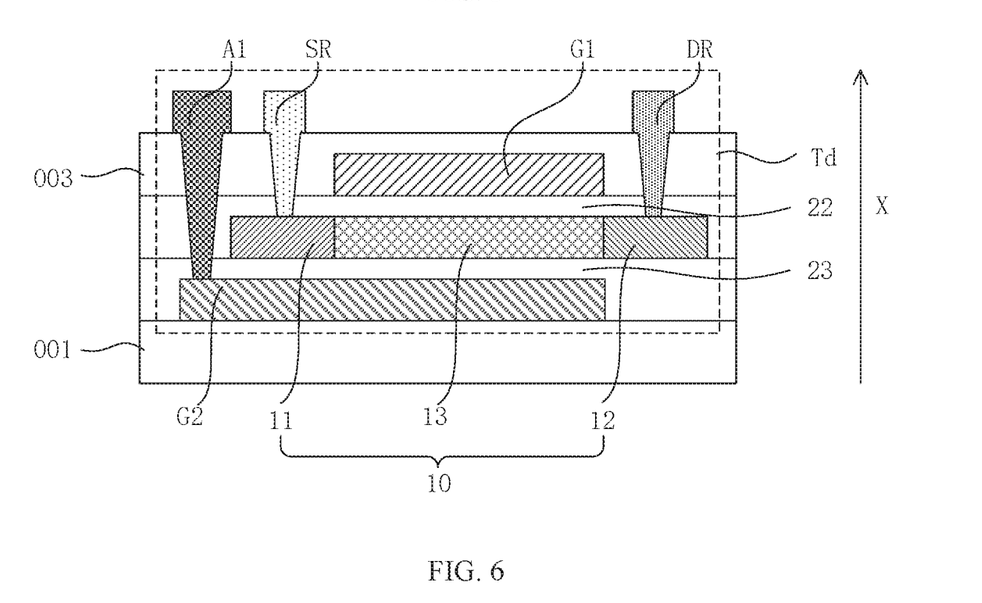
FIG. 6 is a cross-sectional view of another driving transistor according to an embodiment of the present disclosure.
Figure 7:
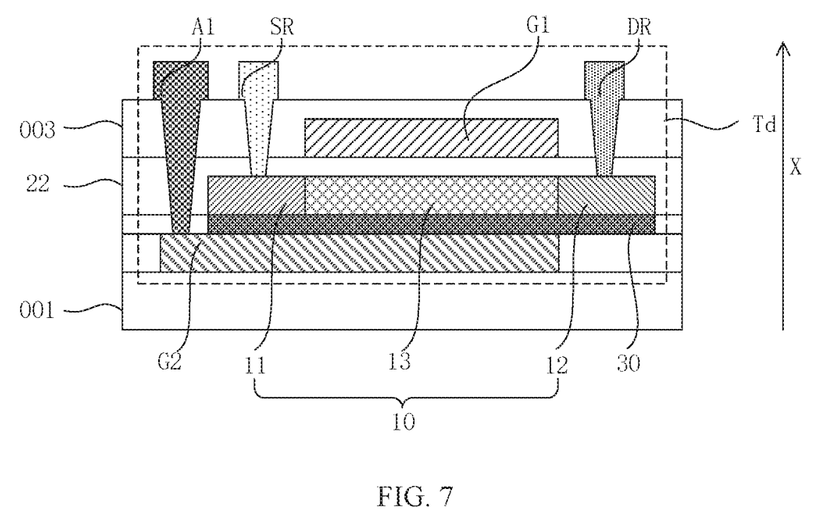
FIG. 7 is a cross-sectional view of still another driving transistor according to an embodiment of the present disclosure.

FIG. 6 is a cross-sectional view of another driving transistor according to an embodiment of the present disclosure, and FIG. 7 is a cross-sectional view of still another driving transistor according to an embodiment of the present disclosure.

As shown in FIG. 6 and FIG. 7, the first gate G1 and the second gate G2 of the driving transistor Td are located at different sides of the active layer 10 in the first direction X. For example, as shown in FIG. 2, the first gate G1 is located at the upper side of the active layer 10, and the second gate G2 is located at the lower side of the active layer 10. Since the first gate G1 and the second gate Ci2 are located at different sides of the active layer 10, both the first gate G1 and the second gate G2 then can be arranged to be close to the active layer 10. In this way, the first gate G1 can more effectively control on and off of the driving transistor Td, and the second gate G2 can more effectively perform light adjustment.

With reference to FIG. 6, a second insulation layer 22 is provided between the first gate G1 and the active layer 10 of the driving transistor Td, and a third insulation layer 23 is provided between the second gate G2 and the active layer 10. That is, the first gate G1. is insulated from the active layer 10 through the second insulation layer 22, and the second gate G2 is insulated from the active layer 10 through the third insulation layer 23. Then, the first gate G1 and the second gate G2 generate electric fields having different directions in the channel region 13 to control generation of a channel and a width of the channel, controlling on and off of the driving transistor Td and the magnitude of the light-emitting driving current generated by the driving transistor Td. In addition, an insulation layer 003 is further provided between film layers where the first gate G1 and the first source SR are located.

When the first gate G1 and the second gate G2 are located at different sides of the active layer 10, in the light adjustment phase, if one of the first potential difference $V_1$ and the second potential difference $V_2$ is a positive value and the other one is a negative value, then the direction of the first electric field E1 is the same as the direction of the second electric field E2, and thus the brightness can be turned up, and if the first potential difference $V_1$ and the second potential difference $V_2$ are both positive values or both negative values, then the direction of the first electric field E1 is opposite to the direction of the second electric field E2, and thus the brightness can be turned down. Further, the greater absolute value of the second potential difference $V_2$ leads to the greater degree of adjustment on the brightness.

In the phase other than the light adjustment phase, if one of the third voltage difference $V_3$ and the fourth voltage difference $V_4$ may be a positive value and the other one may be a negative value, then the direction of the third electric field E3 is the same as the direction of the fourth electric field E4, and thus the potential of the gate of the driving transistor Td can control it to be turned on. Alternatively, in the phase other than the light adjustment phase, if the third voltage difference $V_3$ and the fourth voltage difference $V_4$ may be both positive values or both negative values, and the absolute value of the third voltage difference $V_3$ is greater than the absolute value of the fourth voltage difference $V_4$, so that the direction of the vector sum of the third electric field E3 and the fourth electric field E4 is still the same as the direction of the third electric field E3, and thus an off state of the driving transistor Td is still controlled by the first gate G1. In an embodiment of the present disclosure, the first signal voltage may be the power supply voltage. As shown in FIG. 5, the first signal line L1 may be reused as the power supply voltage signal line PVDD.

With reference to FIG. 7, a semiconductor layer 30 is provided between the second gate G2 and the active layer 10 of the driving transistor Td, and a majority carrier of the semiconductor layer 30 are different from those in the source region 11 and the drain region 12. For example, when the driving transistor Td is a P-type transistor, both the source region 11 and the drain region 12 are heavily doped P-type regions, that is, a majority carrier of the source region 11 and the drain region 12 of the P-type driving transistor Td are holes, while the semiconductor layer 30 is a heavily doped N-type semiconductor, that is, the majority carrier of the semiconductor layer 30 is an electron. In addition, an insulation layer is provided between the first gate G1 and the active layer 10, and then the first gate G1 and the second gate G2 generate electric fields having different directions in the channel region 13 to control generation of a channel and a width of the channel, controlling on and off of the driving transistor Td and the magnitude of the light-emitting driving current generated by the driving transistor Td. In addition, an insulation layer 003 is further provided between film layers where the first gate G1 and the first source SR are located.

When the first gate G1 and the second gate G2 are located at different sides of the active layer 10, in the light adjustment phase, if one of the first potential difference $V_1$ and the second potential difference $V_2$ is a positive value and the other one is a negative value, then the direction of the first electric field E1 is the same as the direction of the second electric field E2, and thus the brightness can be turned up, and if the first potential difference $V_1$ and the second potential difference $V_2$ are both positive values or both negative values, then the direction of the first electric field E1 is opposite to the direction of the second electric field E2, and thus the brightness can be turned down. Further, the greater absolute value of the second potential difference $V_2$ leads to the greater degree of adjustment on the brightness.

In addition, in a vertical region of the source region 12 along the first direction X, a majority carrier of the source region 12 is different from that of the semiconductor layer 30, and thus a PN junction is formed in the vertical region of the source region 12 along the first direction X. The majority carrier of the source region 12 is a hole, and the majority carrier of the semiconductor layer 30 is an electron. In the light adjustment phase, the potential of the first source SR is the power supply voltage, and the potential of the second gate G2 is the light adjustment voltage, where the power supply voltage is greater than the light adjustment voltage. In this case, the PN junction formed in the vertical region of the source region 12 along the first direction X is turned on, so that a part of the current flows to the second gate G2, reducing the light-emitting driving current flowing to the emitting device 01, and thus achieving brightness adjustment.

In the phase other than the light adjustment phase, one of the third voltage difference $V_3$ and the fourth voltage difference $V_4$ may be a positive value and the other one is a negative value, so that the direction of the third electric field E3 is the same as the direction of the fourth electric field E4 and thus the potential of the gate of the driving transistor Td can control it to be turned on. In addition, if the driving transistor Td is a P-type transistor, the third voltage difference $V_3$ is a negative value, and the fourth voltage difference $V_4$ is a positive value, which is equivalent to adding a positive bias voltage to the second gate G2, then the PN junction formed in the vertical region of the source region 12 along the first direction X forms a reverse bias. That is, the PN junction is turned off, avoiding an affection on the driving transistor Td. In an embodiment of the present disclosure, since the potential of the first source SR of the driving transistor Td is the data voltage or the power supply voltage, in order to apply a positive bias voltage to the second gate G2, the first signal voltage shall be greater than the data voltage and the power supply voltage.

Figure 8:
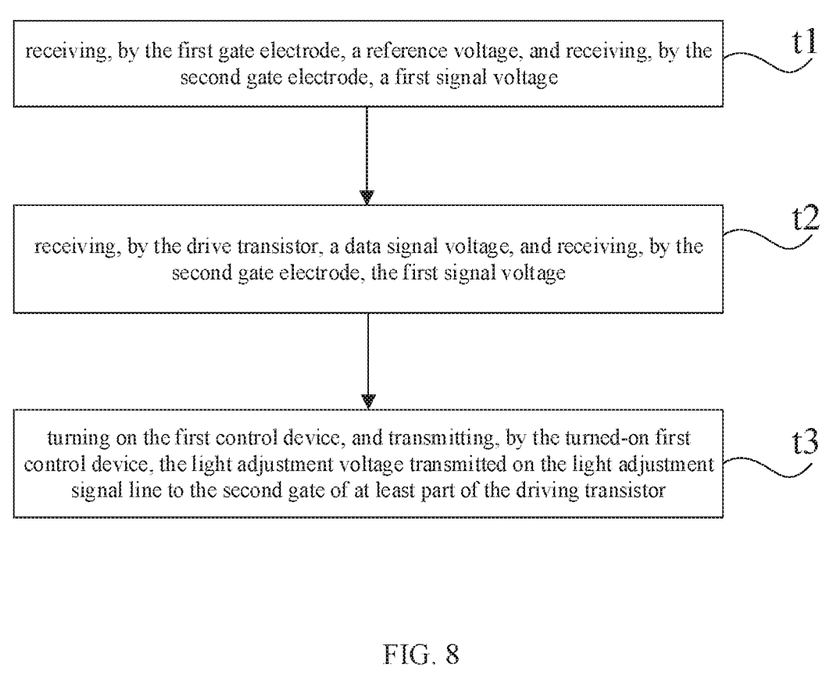
FIG. 8 is a flowchart of a driving method for a light-emitting driving circuit according to an embodiment of the present disclosure.

An embodiment of the present disclosure further provides a driving method for a light-emitting driving circuit, which is configured to drive the light-emitting driving circuit provided in any one of the foregoing embodiments. FIG. 8 is a flowchart of a driving method for a light-emitting driving circuit according to an embodiment of the present disclosure. As shown in FIG. 8, a display phase of the light-emitting driving circuit includes a plurality of cycles, and each cycle includes an initialization phase t1, a data signal writing phase t2, and a light-emitting phase t3 that sequentially occur.

In the initialization phase if, the first gate G1 of the driving transistor Td receives the reference voltage, and the second gate G2 of the driving transistor Td receives the first signal voltage. A difference between the voltage of the first gate G1 and the voltage of the first source SR is the third voltage difference $V_3$, and a difference between the voltage of the second gate G2 and the first source SR is the fourth voltage difference $V_4$. An electric field formed between the first gate G1 and the first source SR is the third electric field E3, and an electric field formed between the second gate G2 and the active layer 10 is the fourth electric field E4. The direction of the vector sum of the third electric field E3 and the fourth electric field E4 is the same as the direction of the third electric field E3. Therefore, the first signal voltage does not affect the initialization of the driving transistor Td. In addition, in the initialization phase, the light-emitting device 01 may also be initialized.

In the data signal writing phase t2, the driving transistor Td receives the data voltage, and second gate G2 receives the first signal voltage. Specifically, the first source SR of the driving transistor Td receives the data voltage. At beginning of the data signal writing phase t2, the potential of the first gate G1 of the driving transistor Td is the reference voltage, which is smaller than the data voltage, and the direction of the vector sum of the third electric field E3 and the fourth electric field E4 is the same as the direction of the third electric field E3. In other words, the potential of the gate of the driving transistor Td is lower than the potential of the first source SR of the driving transistor Td, so that the driving transistor Td is turned on. At this time, the data voltage starts to be written into the first gate G1 of the driving transistor Td. This process is also a process of a threshold compensation for the driving transistor Td.

The light-emitting phase t3 includes a light-emitting phase in which light adjustment is required and a light-emitting phase in which no light adjustment is required. The embodiments of the present disclosure mainly involve the light-emitting phase t3 in which light adjustment is required. In the light-emitting phase t3 in which light adjustment is required. the first control device M1 is turned on, the light adjustment voltage is transmitted on the light adjustment signal line, and the light adjustment voltage is transmitted to the second gate G2 of the driving transistor Td, e.g., to the second gate G2 of the driving transistor Td corresponding to the light-emitting device 01 for which light adjustment is required. At this time, in the driving transistor Td, the difference between the voltage of the first gate G1 and the voltage of the first source SR is the first voltage difference $V_1$, the electric field formed between the first gate G1 and the active layer 10 is the first electric field E1, the difference between the voltage of the second gate G2 and the voltage of the first source SR is the second voltage difference $V_2$, and the electric field formed between the second gate G2 and the active layer 10 is the second electric field E2. When the direction of the first electric field E1 is the same as the direction of the second electric field E2, the electric field in the channel region 13 is increased, and the thickness of the channel conductive layer is increased. In this case, the light-emitting driving current is increased, and the brightness of the light-emitting device 10 is increased. When the direction of the first electric field E1 is different from the direction of the second electric field E2, the electric field in the channel region 13 is reduced, and the thickness of the channel conductive layer is reduced. In this case, the light-emitting driving current is reduced, and the brightness of the light-emitting device is reduced.

The light adjustment voltage can be determined based on the required degree of light adjustment, adjusting the magnitude of the light-emitting driving current generated by the driving transistor Td.

The first control device Ml includes a control transistor T0, and the control transistor T0 has a source connected to the input terminal of the first control device M1, and a drain connected to the output terminal of the first control device Mi. That is, the source of the control transistor T0 is connected to the light adjustment signal line Dim, and the drain of the control transistor T0 is connected to the second gate G2. In the light adjustment phase, the control transistor T0 is turned on, and the light adjustment voltage transmitted on the light adjustment signal line Dim is transmitted to the second gate G2 through the control transistor T0.

In an embodiment of the present disclosure, as shown in FIG. 2, the first gate G1 and the second gate G2 are located at a same side of the active layer 10 in the first direction X, and the first insulation layer 21 is provided between the second gate G2 and the active layer 10. In this case, in the initialization phase t1 and in the data signal writing phase t2, a product of the third voltage difference $V_3$ and the fourth voltage difference $V_4$ is a positive value. That is, the third voltage difference $V_3$ and the fourth voltage difference $V_4$ may be both positive values or both negative values, so that the direction of the third electric field E3 is the same as the fourth electric field E4. Therefore, the potential of the gate of the driving transistor Td can control it to be turned on.

Alternatively, the product of the third voltage difference $V_3$ and the fourth voltage difference $V_4$ is a negative value. That is, one of the third voltage difference $V_4$ and the fourth voltage difference $V_4$ is a positive value and the other one is a negative value, and the absolute value of the third voltage difference $V_3$ is greater than the absolute value of the fourth voltage difference $V_4$. In this case, the direction of the vector sum of the third electric field E3 and the fourth electric field E4 is still the same as the direction of the third electric field E3. Therefore, an off state of the driving transistor Td is still controlled by the first gate G1.

In an embodiment of the present disclosure, as shown in FIG. 6, the first gate G1 and the second gate G2 are located at different sides of the active layer 10 in the first direction X, and the third insulation layer 23 is provided between the second gate G2 and the active layer 10. Tin this case, in the initialization phase t1 and in the data signal writing phase 12, the product of the third voltage difference $V_3$ and the fourth voltage difference $V_4$ is a negative value. That is, one of the third voltage difference $V_3$ and the fourth voltage difference $V_4$ is a positive value and the other one is a negative value, so that the direction of the third electric field E3 is the same as the direction of the fourth electric field E4. Therefore, the gate potential of the driving transistor Td can control it to be turned on. Alternatively, the product of the third voltage difference $V_3$ and the fourth voltage difference $V_4$ is a positive value. That is, the third voltage difference $V_3$ and the fourth voltage difference $V_4$ are both positive values or both negative values, and the absolute value of the third voltage difference $V_3$ is greater than the absolute value of the fourth voltage difference $V_4$. In this case, the direction of the vector sum of the third electric field E3 and the fourth electric field E4 is still the same as the direction of the third electric field E3. Therefore, an off state of the driving transistor Td is still controlled by the first gate G1.

In an embodiment of the present disclosure, as shown in FIG. 7, the first gate G1 and the second gate G2 are located at different sides of the active layer 10 in the first direction X, the semiconductor layer 30 is provided between the second gate G2 and the active layer 10, and the majority carrier of the semiconductor layer 30 is different from that in the source region 11 and the drain region 12. In this case, in the initialization phase t1 and in the data signal writing phase t2, in the phase other than the light adjustment phase, the product of the third voltage difference $V_3$ and the fourth voltage difference $V_4$ may be a negative value, that is, one of the third voltage difference $V_3$ and the fourth voltage difference $V_4$ is a positive value and the other one is a negative value. In this case, the direction of the third electric field E3 is the same as the direction of the fourth electric field E4. Therefore, the potential of the gate of the driving transistor Td can control it to be turned on. In addition, if the driving transistor Td is a P-type transistor, the third voltage difference $V_3$ should be a negative value, and the fourth voltage difference $V_4$ should be a positive value, which is equivalent to adding a positive bias voltage to the second gate G2. In this case, the PN junction formed in the vertical region of the source region 12 along the first direction X forms a reverse bias. That is, the PN junction is turned off, avoiding an affection on the driving transistor Td.

The driving method for the light-emitting driving circuit according to this embodiment of the present disclosure controls the light adjustment voltage of the second gate of the driving transistor, controlling formation of a channel in the active layer and controlling a thickness of the channel conductive layer. In this way, the light-emitting driving current generated by the driving transistor can be adjusted, achieving adjustment on brightness of the light-emitting device.

Figure 9:
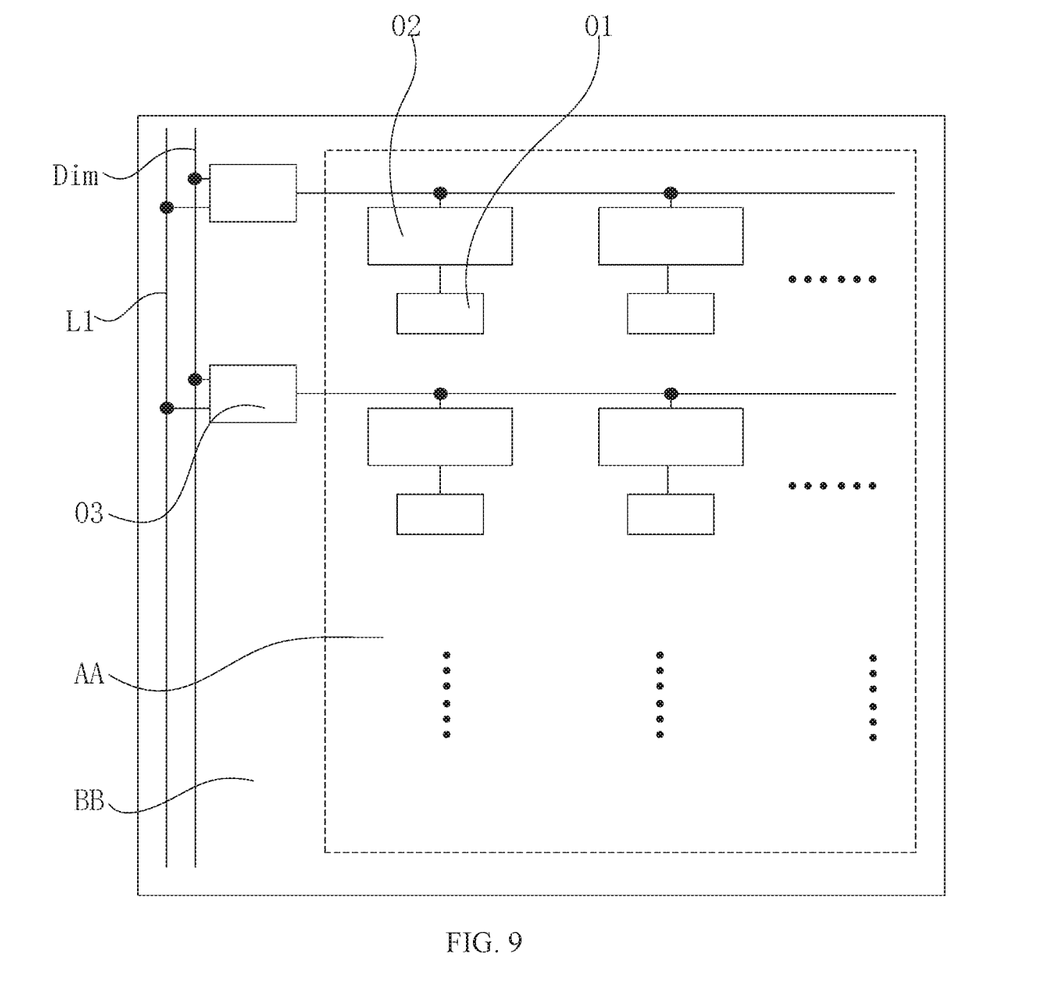
FIG. 9 is a schematic diagram of an organic light-emitting display panel according to an embodiment of the present disclosure.

FIG. 9 is a schematic diagram of an organic light-emitting display panel according to an embodiment of the present disclosure. As shown in FIG. 9, an embodiment of the present disclosure further provides an organic light-emitting display panel. The organic light-emitting display panel includes the light-emitting driving circuit provided in any one of the foregoing embodiments. Moreover, the organic light-emitting display panel includes a display area AA and a non-display area. BB disposed outside the display area AA. The light-emitting driving circuit includes the light-emitting device 01, the pixel driving circuit 02, and the second gate control circuit 03. The light-emitting device 01 and the pixel driving circuit are located in the display area. AA of the organic light-emitting display panel, and the second gate control circuit 03 is located in the non-display area BB of the organic light-emitting display panel.

For the organic light-emitting display panel provided by this embodiment of the present disclosure, the light adjustment voltage of the second gate of the driving transistor of the pixel driving circuit can control formation of a channel in the active layer and control a thickness of the channel conductive layer. In this way, the light-emitting driving current generated by the driving transistor can be adjusted, achieving adjustment on brightness of the light-emitting device.

Figure 10:
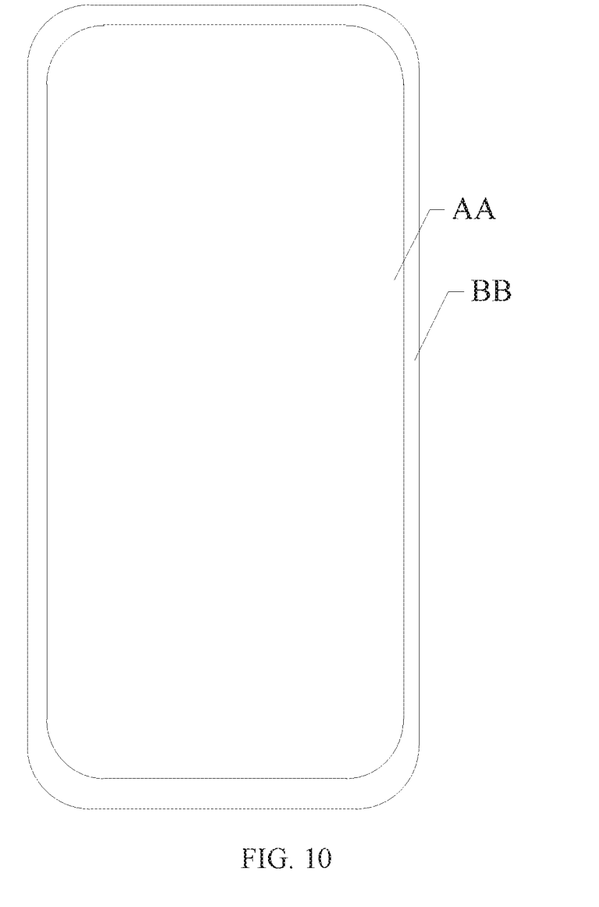
FIG. 10 is a schematic diagram of an organic light-emitting display device according to an embodiment of the present disclosure.

FIG. 10 is a schematic diagram of an organic light-emitting display device according to an embodiment of the present disclosure. The organic light-emitting display device includes the organic light-emitting display panel provided in any of the foregoing embodiments. As shown in FIG. 10, the organic light-emitting display device provided by this embodiment of the present disclosure may be a mobile phone. In addition, the organic light-emitting display device provided by this embodiment of the present disclosure may also be a display device such as a computer or a television.

For the organic light-emitting display device provided by this embodiment of the present disclosure, the light adjustment voltage of the second gate of the driving transistor of the pixel driving circuit can control formation of a channel in the active layer and control a thickness of the channel conductive layer. In this way, the light-emitting driving current generated by the driving transistor can be adjusted, achieving adjustment on brightness of the light-emitting device.

What is claimed is:

1. A light-emitting driving circuit, comprising:
   a light-emitting device for light-emitting and display;
   a pixel driving circuit comprising a driving transistor configured to output a light-emitting driving current to the light-emitting device, wherein the driving transistor comprises an active layer, a first source, a first drain, a first gate and a second gate, the active layer comprises a source region connected to the first source, a drain region connected to the first drain, and a channel region, both the first gate and the second gate at least partially overlap with the active layer, and the first gate is insulated from the second gate in a first direction; the first drain is electrically connected to the light-emitting device; and the first direction is perpendicular to a plane of the active layer; and
   a second gate control circuit comprising a first control device, wherein the first control device has an input terminal electrically connected to a light adjustment signal line, and an output terminal electrically connected to the second gate; and a light adjustment voltage is transmitted on the light adjustment signal line in a light adjustment phase.

2. The light-emitting driving circuit according to claim 1, wherein the light-emitting device comprises an organic light-emitting diode, and the first drain is electrically connected to one of an anode and a cathode of the organic light-emitting diode.

3. The light-emitting driving circuit according to claim 1, wherein the first gate and the second gate are located at a same side of the active layer in the first direction, and a first insulation layer is provided between the first gate and the second gate.

4. The light-emitting driving circuit according to claim 3, wherein the second gate is located at a side of the first gate close to the active layer.

5. The light-emitting driving circuit according to claim 1, wherein the first gate and the second gate are located at different sides of the active layer in the first direction.

6. The light-emitting driving circuit according to claim 5, wherein a second insulation layer is provided between the first gate and the active layer, and a third insulation layer is provided between the second gate and the active layer.

7. The light-emitting driving circuit according to claim 5, wherein a semiconductor layer is provided between the second gate and the active layer, and a majority carrier of the semiconductor layer is different from that in the source region and the drain region.

8. The light-emitting driving circuit according to claim 1, wherein the first control device comprises a control transistor having a source connected to the input terminal of the first control device, and a drain connected to the output terminal of the first control device.

9. The light-emitting driving circuit according to claim 1, wherein the second gate control circuit further comprises a second control device having an input terminal connected to a first signal line, and an output terminal electrically connected to the second gate;

a first signal voltage is transmitted on the first signal line, and when the second gate receives the first signal voltage, a third electric field is formed between the first gate and the active layer and a fourth electric field is formed between the second gate and the active layer, wherein a direction of a vector sum of the third electric field and the fourth electric field is identical to a direction of the third electric field; and the input terminal of the second control device, the input terminal of the first control device and the second gate are electrically conducted in different time periods.

10. The light-emitting driving circuit according to claim 9, wherein the second control device comprises a semiconductor resistor having a terminal connected to the input terminal of the second control device, and another terminal connected to the output terminal of the second control device.

11. A driving method for driving the light-emitting driving circuit according to claim 1, wherein the driving method comprises:

in the light adjustment phase, transmitting, by the first control device, the light adjustment voltage transmitted on the light adjustment signal line to the second gate of the driving transistor.

12. The driving method. according to claim 11, wherein the first control device comprises a control transistor having a source connected to the input terminal of the first control device, and a drain connected to the output terminal of the first control device; and in the light adjustment phase, the control transistor is turned on.

13. The driving method according to claim 11, wherein the driving method further comprises an initialization phase and a data signal writing phase, and the driving method comprises:

in the initialization phase, receiving, by the first gate, a reference voltage, and receiving, by the second gate, a first signal voltage; and in the data signal writing phase, receiving, by the driving transistor, a data signal voltage, and receiving, by the second gate, the first signal voltage, wherein in the initialization phase and in the data signal writing phase, a third electric field is formed between the first gate and the active layer, and a fourth electric field is formed between the second gate and the active layer, wherein a direction of a vector sum of the third electric field and the fourth electric field is identical to a direction of the third electric field.

14. The driving method according to claim 13, wherein the first gate and the second gate are located at a same side of the active layer in the first direction, and a first insulation layer is provided between the second gate and the active layer;

in the initialization phase and in the data signal writing phase, a difference between a voltage of the first gate and a voltage of the first source is a third voltage difference, and a difference between a voltage of the second gate and the voltage of the first source is a fourth voltage difference; and in the initialization phase and in the data signal writing phase, a product of the third voltage difference and the fourth voltage difference is a positive value; or the product of the third voltage difference and the fourth voltage difference is a negative value and an absolute value of the third voltage difference is greater than an absolute value of the fourth voltage difference.

15. The driving method according to claim 13, wherein the first gate and the second gate are located at different sides of the active layer in the first direction, and a third insulation layer is provided between the second gate and the active layer;

in the initialization phase and in the data signal writing phase, a difference between a voltage of the first gate and a voltage of the first source is a third voltage difference, and a difference between a voltage of the second gate and the voltage of the first source is a fourth voltage difference; and in the initialization phase and in the data signal writing phase, a product of the third voltage difference and the fourth voltage difference is a negative value; or the product of the third voltage difference and the fourth voltage difference is a positive value and an absolute value of the third voltage difference is greater than an absolute value of the fourth voltage difference.

16. The driving method according to claim 13, wherein the first gate and the second gate are located at different sides of the active layer in the first direction, and a semiconductor layer is provided between the second gate and the active layer; and a majority carrier of the semiconductor layer is different from that in the source region and the drain region;

in the initialization phase and in the data signal writing phase, a difference between a voltage of the first gate and a voltage of the first source is a third voltage difference, and a difference between a voltage of the second gate and the voltage of the first source is a fourth voltage difference; and in the initialization phase and in the data signal writing phase, a product of the third voltage difference and the fourth voltage difference is a negative value.

17. An organic light-emitting display panel, comprising the light-emitting driving circuit according to claim 1.

18. The organic light-emitting display panel according to claim 17, wherein the organic light-emitting display panel has a display area and a non-display area, the pixel driving circuit is located in the display area, and the second gate control circuit is located in the non-display area.

19. An organic light-emitting display device, comprising the organic light-emitting display panel according to claim 17.

* * * * *